(12) United States Patent
Zong

(10) Patent No.: US 11,853,133 B2
(45) Date of Patent: Dec. 26, 2023

(54) SIPHON-BASED HEAT SINK FOR SERVER

(71) Applicant: ZHENGZHOU YUNHAI INFORMATION TECHNOLOGY CO., LTD., Henan (CN)

(72) Inventor: Bin Zong, Henan (CN)

(73) Assignee: ZHENGZHOU YUNHAI INFORMATION TECHNOLOGY CO., LTD., Henan (CN)

( * ) Notice: Subject to any disclaimer, the term of this patent is extended or adjusted under 35 U.S.C. 154(b) by 316 days.

(21) Appl. No.: 17/281,253

(22) PCT Filed: May 30, 2019

(86) PCT No.: PCT/CN2019/089282
§ 371 (c)(1),
(2) Date: Mar. 30, 2021

(87) PCT Pub. No.: WO2020/073668
PCT Pub. Date: Apr. 16, 2020

(65) Prior Publication Data
US 2022/0004234 A1   Jan. 6, 2022

(30) Foreign Application Priority Data

Oct. 10, 2018   (CN) .......................... 201811177633.4

(51) Int. Cl.
*G06F 1/20* (2006.01)
*F28F 3/06* (2006.01)

(52) U.S. Cl.
CPC . *G06F 1/20* (2013.01); *F28F 3/06* (2013.01)

(58) Field of Classification Search
CPC ..... G06F 1/20; F28F 3/06; F28F 1/325; F28F 1/40; F28F 1/42; F28F 3/04;
(Continued)

(56) References Cited

U.S. PATENT DOCUMENTS 8,345,423 B2 * 1/2013 Campbell ........... F28D 15/0233
257/714
2005/0126757 A1 * 6/2005 Bennett ..................... F28F 1/40
165/104.11
(Continued)

FOREIGN PATENT DOCUMENTS

CN    102789295 A    11/2012
CN    103344142 A    10/2013
(Continued)

OTHER PUBLICATIONS

International Search Report for PCT/CN2019/089282 dated Sep. 6, 2019, ISA/CN.

*Primary Examiner* — Adam B Dravininkas
(74) *Attorney, Agent, or Firm* — Apex Attorneys at Law, LLP; Yue (Robert) Xu

(57) ABSTRACT

A siphon-based heat sink for a server comprises a heat absorbing mechanism, a siphon mechanism, and a heat sink. The heat absorbing mechanism comprises a base plate and a cover plate. The base plate comprises a bottom plate and multiple sets of heat dissipating fins, and is in contact with the central processing unit. The heat sink comprises a cooling cavity and cooling fins. The evaporation cavity is communicated with the cooling cavity via two siphon tubes to enable heat transfer and circulation of a thermal conductive medium. Lower ends of the two fin plates are positioned close to and fixed to the bottom plate, while upper ends thereof are bent outward to form a curved mechanism, and an included angle between the two fin plates continuously increases from bottom to top.

8 Claims, 2 Drawing Sheets

(58) Field of Classification Search
CPC ............... F28D 15/025; F28D 15/0275; F28D 15/0266; F28D 15/0233; H05K 7/20809; H05K 7/20336; H05K 7/20309
See application file for complete search history.

(56) References Cited

U.S. PATENT DOCUMENTS

| | | | | |
|---|---|---|---|---|
| 2005/0217829 | A1* | 10/2005 | Belits | ................ H05K 7/20809 |
| | | | | 165/104.33 |
| 2009/0126905 | A1* | 5/2009 | Dinh | ......................... F21K 9/00 |
| | | | | 165/104.33 |
| 2011/0192574 | A1* | 8/2011 | Yoshikawa | ......... F28D 15/0266 |
| | | | | 165/104.21 |

FOREIGN PATENT DOCUMENTS

| | | | |
|---|---|---|---|
| CN | 103884217 | A | 6/2014 |
| CN | 109213298 | A | 1/2019 |
| CN | 208781164 | U | 4/2019 |

\* cited by examiner

SIPHON-BASED HEAT SINK FOR SERVER

The present application is a National Phase entry of PCT Application No. PCT/CN2019/089282, filed on May 30, 2019, which claims the priority to Chinese Patent Application No. 201811177633.4, titled "SIPHON-BASED HEAT SINK FOR SERVER", filed with the China National Intellectual Property Administration on Oct. 10, 2018, which are incorporated herein by reference in their entireties.

FIELD

The present disclosure belongs to the field of heat dissipation technology, and in particular relates to a siphon-based heat sink for a server that is able to make full use of an existing air volume of a node in combination with siphon technology.

BACKGROUND

With the development of new technologies such as cloud computing and big data, the requirements of bandwidth and capacity for date storage become higher and higher, the calculation speed and calculation amount of a central processing unit (CPU) are also increasing, and the power consumption is thus increasing. Correspondingly, the temperatures of various components such as a memory, a hard disk, etc., are also increasing, and a space in a case is limited, so that the heat dissipation of an electronic device is a prominent problem at present.

Nowadays, a server has higher and higher demands on the hard disk and the CPU. As the calculation amount increases, the requirement for the performance of the CPU is getting higher and higher, and the power consumption of the CPU become higher and higher. In order to solve the overtemperature problem of various electronic devices, the effective means should not only simply increase the air volume, but also make full use of the limited air volume for optimizing the heat dissipation system integrally based on the characteristics of a model, so as to meet the temperature specifications (Spec) of various electronic devices. For the model of a computer, the CPU with a higher performance can bring higher processing capacity, but the CPU with the higher performance faces a big problem that, the higher the performance is, the greater the power consumption is. How to effectively reduce the temperature of the CPU to its corresponding range of the Spec to meet its own performance requirements, plus the constraints for the power consumption of an existing fan and noise, is a difficult bottleneck point in the overall design of the server.

The existing optimized solution is to use the siphon technology to bring the heat generated by the CPU to a cooling end in time and rapidly, and provide enough fins at the cooling end to dissipate the heat, thereby improving the heat dissipation performance of a heat sink, and the original fan performance may be maintained within the original motherboard layout to meet the heat dissipation requirement of the CPU. The biggest difference between the heat sink and a conventional heat tube radiator is the use of double tubes for circulating backflow, while the conventional heat tube radiator uses an inner circulation of a thermal conductive medium in a signal tube. This method enhances the flow of the medium, thereby increasing the rate at which the heat source is taken away, and enhancing the performance of the heat sink. The test verification result shows that under the operating conditions of 20CFM and 165WCPU, the use of the siphon-base heat sink reduces the temperature of the CPU by about 12 degrees compared with the conventional heat tube radiator, and the improvement effect is apparent. But for a CPU with a higher power consumption, the optimized efficiency of the heat sink still has shortcomings, making it difficult for the temperature of the CPU to meet the Spec.

SUMMARY

A siphon-based heat sink for a server is provided according to the present disclosure for solving the problems in the conventional technology.

The present disclosure is implemented through the following technical solutions:

a siphon-based heat sink for a server includes a heat absorbing mechanism, a siphon mechanism, and a heat sink, and the heat absorbing mechanism is installed at an upper portion of a central processing unit (CPU), the heat absorbing mechanism includes a base plate and a cover plate, and the base plate and the cover plate are buckled to form an evaporation cavity, the base plate includes a bottom plate and a plurality of sets of heat dissipating fins installed on an inner surface of the bottom plate, and the bottom plate is in contact with the central processing unit (CPU); the siphon mechanism includes two siphon tubes; the heat sink includes a cooling cavity and cooling fins, the evaporation cavity is communicated with the cooling cavity through the two siphon tubes for heat transfer and circulation of a thermal conductive medium; each set of the heat dissipating fins is composed of two fin plates arranged symmetrically, lower ends of the two fin plates are positioned close to each other and fixed to the bottom plate, and uppers ends of the two fin plates are bent outward to form a curved mechanism, and an included angle between the two fin plates gradually increases from bottom to top, which facilitates bubble formation and evaporation of the thermal conductive medium between the two fin plates and conducting heat.

In the siphon-based heat sink for the server described above, the two siphon tubes are respectively an evaporation tube and a return tube, and a diameter of the evaporation tube is 1.5 to 3 times a diameter of the return tube.

In the siphon-based heat sink for the server described above, a horizontal position of the return tube is relatively lower than a horizontal position of the evaporation tube.

In the siphon-based heat sink for the server described above, the cover plate is inclined.

In the siphon-based heat sink for the server described above, a width of the upper end of the fin plate is smaller than a width of the lower end of the fin plate.

In the siphon-based heat sink for the server described above, a side of the fin plate is curved.

In the siphon-based heat sink for the server described above, the included angle between tangents of inner sides of the two fin plates is between 0 degree and 60 degrees.

In the siphon-based heat sink for the server described above, a height of the fin plate ranges from 1 cm to 2 cm, and a width of the lower end of the fin plate ranges from 0.5 cm to 1 cm.

Compared with the conventional technology, the advantages of the present disclosure are:

1. a novel siphon-based heat sink is provided according to the present disclosure, which improves the existing siphon-based heat sink in terms of system and structure. The fins at a heating end of the heat sink are bent to two sides to facilitate the heat transfer of the thermal conductive medium; the two siphon tubes at the cooling end, one is high and the other is low, and the two siphon tubes at the heating end, one is high and the other is low; a slope is provided at the evaporation end, all these structures enhance the heat dissipation performance of the heat sink, so that the heat dissipation requirements of the CPU may be met at a low air speed, not by increasing the air volume of the fan, but by optimizing the structure of the heat sink.

2. the present disclosure may be used for the model with a low air volume of computing node and a high power of the CPU, so as to make full use of the existing air volume to greatly reduce the temperature of the CPU.

BRIEF DESCRIPTION OF THE DRAWINGS

For more clearly illustrating embodiments of the present disclosure or the technical solutions in the conventional technology, drawings to be used in the description of the embodiments or the conventional technology will be briefly described hereinafter.

Figure 1:
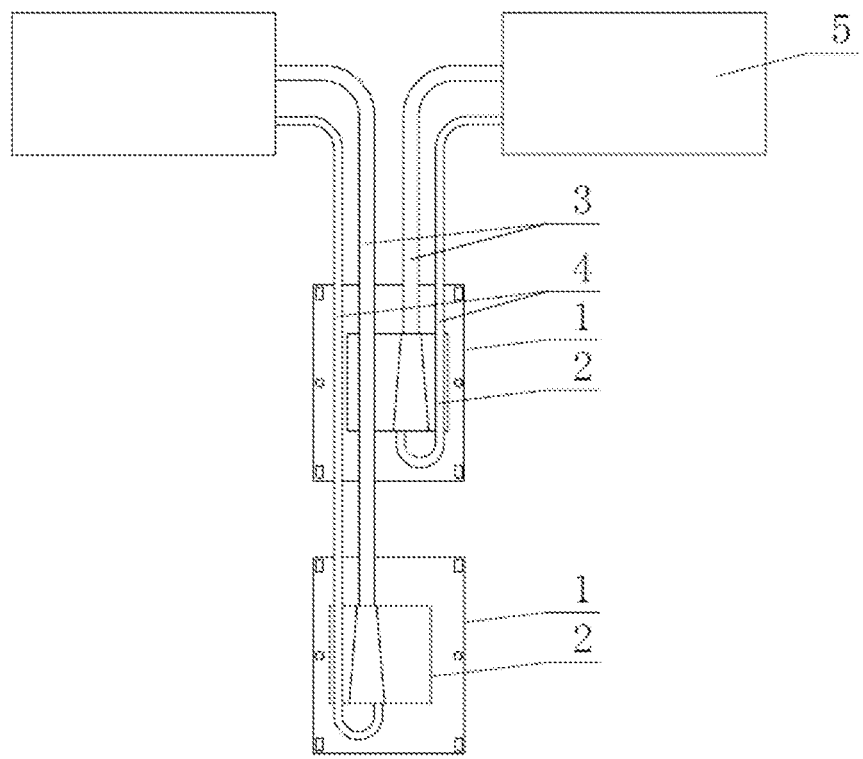
FIG. 1 is a structural schematic view of the present disclosure.
Figure 2:
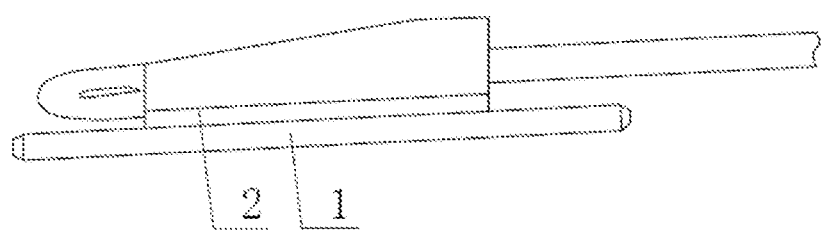
FIG. 2 is a structural schematic view of a heat absorbing mechanism in FIG. 1.

| Reference numerals: | |
| --- | --- |
| 1 base plate; | 11 bottom plate, |
| 12 heat dissipation fin, | 2 cover plate, |
| 3 evaporation tube, | 4 return tube, |
| 5 heat sink. | |

DETAILED DESCRIPTION OF THE EMBODIMENTS

To make the purposes, the technical solutions and the advantages of the embodiments of the present disclosure more clear, the technical solutions according to the embodiments of the present disclosure will be described clearly and completely as follows in conjunction with the drawings in the embodiments of the present disclosure. It is apparent that the described embodiments are only a part of the embodiments according to the present disclosure, rather than all of the embodiments.

The following describes the technical terms referred to in the embodiments:
the full name of Spec is specification requirement; the full name of CPU is Central Processing Unit; the full name of HS is heatsink, which means heat sink 5 in this article, and Tcase means surface temperature.

As shown in FIGS. 1 to 5, a siphon-based heat sink 5 for a server is provided according to an embodiment, the heat sink 5 is mainly divided into three parts: a heat absorbing mechanism, a siphon mechanism and a heat sink 5. The heat absorbing mechanism is located on an upper portion of CPU, the siphon mechanism is used for transferring heat and a thermal conductive medium, and the heat sink 5 is a cooling end with a cooling cavity and cooling fins.

The heat absorbing mechanism includes a base plate 1 and a cover plate 2. The base plate 1 and the cover plate 2 are buckled to form an evaporation cavity. The base plate 1 includes a bottom plate 11 and multiple sets of heat dissipating fins 12 installed on an inner surface of the bottom plate 11, and is in contact with the central processing unit (CPU). The cover plate 2 is a certain inclined slope, which may better realize the transfer and return of the thermal conductive medium in the siphon tube in the evaporation cavity.

The siphon mechanism includes two siphon tubes; the heat sink 5 includes the cooling cavity and the cooling fins, the evaporation cavity is communicated with the cooling cavity through the two siphon tubes for heat transfer and circulation of the thermal conductive medium. The two siphon tubes are respectively an evaporation tube 3 and a return tube 4, and a diameter of the evaporation tube 3 is 1.5 to 3 times a diameter of the return tube 4. A horizontal position of the return tube 4 is relatively lower than a horizontal position of the evaporation tube 3.

Each set of the heat dissipating fins 12 is composed of two fin plates arranged symmetrically, lower ends of the two fin plates are positioned close to each other and fixed to the bottom plate 11, and uppers ends thereof are bent outward to form a curved mechanism, and an included angle between the two fin plates continuously increases from bottom to top, which facilitates bubble formation and evaporation of the thermal conductive medium between the two fin plates and conducting heat. A width of the upper end of the fin plate is smaller than a width of the lower end thereof, a side of the fin plate is curved, and the tangent angle between inner sides of the two fin plates is between 0 degree and 60 degrees.

Figure 3:
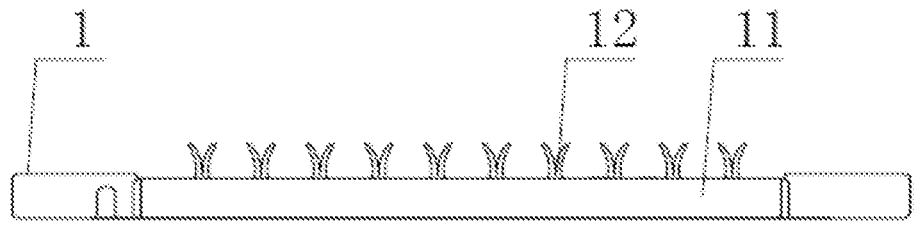
FIG. 3 is a structural schematic view of a base plate in FIG. 2.

The structures of the fin plate and the heat dissipation fin 12 play an important role in the heat conduction of the heat absorbing mechanism. The shape of the heat dissipation fin 12 in this embodiment is shown in FIG. 3, and the fin is bent to two sides viewed from a front view. The heat generated on the base plate 1 is transferred to this part, and is more likely to generate bubbles, and the thermal conductive medium is more likely to form bubbles to evaporate and conduct heat.

Figure 4:
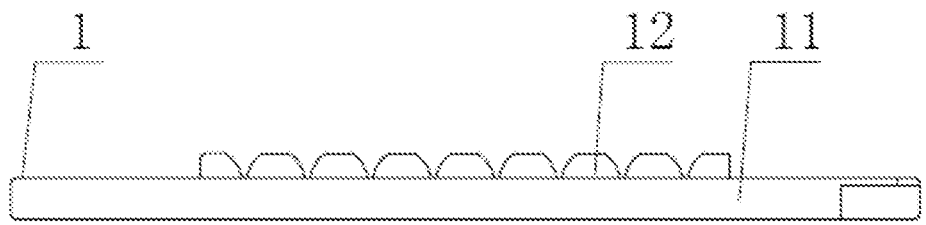
FIG. 4 is a side view of FIG. 3.

As shown in FIG. 4, the structure bent to two sides is also beneficial to increase the rate of liquid phase change to gas, and enhance the heat conduction effect.

Figure 5:
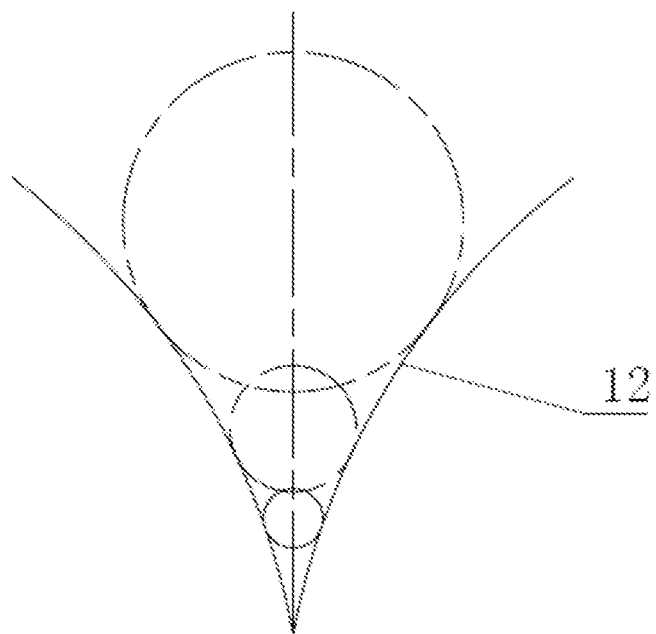
FIG. 5 is a working principle view of heat dissipation fins described in FIG. 3.

As shown in FIG. 5, in the process of generation to detachment of onebubble of the thermal conductive medium, an included angle between a tangent line of the bubble and a tangent line of a contact point of the curved fin becomes smaller and smaller, and the adsorption force of the bubble becomes smaller and smaller, and is easier to detach; secondly, the heat transferred from the fin makes the heat inside the bubble more and more; the third is the thrust of the lower bubble on the upper bubble. The combined force of three effects increases the generation rate of the bubble, accelerates evaporation, and enhances heat transfer performance.

The thermal conductive medium gas sent from the evaporation tube 3 of the siphon tube enters the cooling cavity, and the thermal conductive medium gas is converted from gas to liquid through the heat dissipation of the heat sink 5 and the cooling fins, and then returns to the evaporation cavity of the heat absorbing mechanism from the return tube 4 at the lower horizontal position. The two siphon tubes with different heights and the evaporation mechanism arranged in an inclined slope structure, are more conductive to the evaporation and return of the thermal conductive medium.

Further, in order to achieve better heat conduction and evaporation effects, a height of the fin plate in this embodiment is 1.5 cm, and a width of the lower end of the fin plate is 0.8 cm.

A novel siphon-based heat sink 5 is provided according to the present disclosure, which improves the existing siphon-based heat sink 5 in terms of system and structure. The fins at a heating end of the heat sink 5 are bent to two sides to facilitate the heat transfer of the thermal conductive medium; one of the two siphon tubes at the cooling end is high and the other is low, and one of the two siphon tubes at the heating end is high and the other is low; a slope is provided at the evaporation end. All these structures enhance the heat dissipation performance of the heat sink 5, so that the heat dissipation requirements of the CPU may be met at a low air speed, not by increasing the air volume of the fan, but by optimizing the structure of the heat sink 5.

The technical contents not described in detail in the present disclosure are all known technologies.

The invention claimed is:

1. A siphon-based heat sink for a server, comprising:
a heat absorbing mechanism,
a siphon mechanism, and
a heat sink,
wherein the heat absorbing mechanism is installed at an upper portion of a central processing unit, the heat absorbing mechanism comprises a base plate and a cover plate, and the base plate and the cover plate are buckled to form an evaporation cavity, the base plate comprises a bottom plate and a plurality of sets of heat dissipating fins installed on an inner surface of the bottom plate, and the bottom plate is in contact with the central processing unit; the siphon mechanism comprises two siphon tubes; the heat sink comprises a cooling cavity and cooling fins, the evaporation cavity is communicated with the cooling cavity through the two siphon tubes for heat transfer and circulation of a thermal conductive medium; each set of the heat dissipating fins is composed of two fin plates arranged symmetrically, lower ends of the two fin plates are positioned close to each other and fixed to the bottom plate, and uppers ends of the two fin plates have tips and the two fin plates are bent outward to form a curved mechanism from the lower ends to the upper ends, and an included angle between the two fin plates gradually increases from bottom to top, which facilitates bubble formation and evaporation of the thermal conductive medium between the two fin plates and conducting heat.

2. The siphon-based heat sink for the server according to claim 1, wherein the two siphon tubes are respectively an evaporation tube and a return tube, and a diameter of the evaporation tube is 1.5 to 3 times a diameter of the return tube.

3. The siphon-based heat sink for the server according to claim 2, wherein a horizontal position of the return tube is relatively lower than a horizontal position of the evaporation tube.

4. The siphon-based heat sink for the server according to claim 1, wherein the cover plate is inclined.

5. The siphon-based heat sink for the server according to claim 1, wherein a width of the upper end of the fin plate is smaller than a width of the lower end of the fin plate.

6. The siphon-based heat sink for the server according to claim 1, wherein a side of the fin plate is curved.

7. The siphon-based heat sink for the server according to claim 1, wherein the included angle between tangents of inner sides of the two fin plates is between 0 degree and 60 degrees.

8. The siphon-based heat sink for the server according to claim 1, wherein a height of the fin plate ranges from 1 cm to 2 cm, and a width of the lower end of the fin plate ranges from 0.5 cm to 1 cm.

\* \* \* \* \*